United States Patent
Ou et al.

(10) Patent No.: US 7,229,521 B2
(45) Date of Patent: Jun. 12, 2007

(54) ETCHING SYSTEM USING A DEIONIZED WATER ADDING DEVICE

(75) Inventors: Chen-Hsien Ou, Miao-Li (TW); Chang Kuei Huang, Miao-Li (TW); Sheng-Chou Gau, Miao-Li (TW); Jung-Lung Huang, Miao-Li (TW); Ching-Feng Chen, Miao-Li (TW); Chih Hung Huang, Miao-Li (TW)

(73) Assignee: Innolux Display Corp., Miao-Li (TW)

( * ) Notice: Subject to any disclaimer, the term of this patent is extended or adjusted under 35 U.S.C. 154(b) by 0 days.

(21) Appl. No.: 11/026,639

(22) Filed: Dec. 30, 2004

(65) Prior Publication Data

US 2005/0183819 A1    Aug. 25, 2005

(30) Foreign Application Priority Data

Feb. 24, 2004    (TW) ............................... 93104584 A

(51) Int. Cl.
*B08B 7/04*    (2006.01)
*B08B 3/00*    (2006.01)

(52) U.S. Cl. ............................ 156/345.13; 156/345.11; 134/1.3; 134/902

(58) Field of Classification Search ........... 156/345.11, 156/345.15, 345.17, 345.33, 345.34, 345.37; 134/1.3, 94.1, 95.1, 902, 58 R, 57 R, 105
See application file for complete search history.

(56) References Cited

U.S. PATENT DOCUMENTS

| | | | | |
|---|---|---|---|---|
| 4,397,708 A | | 8/1983 | Frantzen | |
| 5,947,135 A | * | 9/1999 | Sumida et al. | 134/95.3 |
| 5,950,328 A | * | 9/1999 | Ichiko et al. | 34/364 |
| 6,120,614 A | * | 9/2000 | Damron et al. | 134/10 |
| 6,558,476 B2 | * | 5/2003 | Yokomizo | 134/26 |
| 2002/0157686 A1 | * | 10/2002 | Kenny et al. | 134/1.3 |
| 2003/0079835 A1 | * | 5/2003 | Kajino et al. | 156/345.11 |
| 2004/0134519 A1 | * | 7/2004 | Jung et al. | 134/19 |
| 2004/0211449 A1 | * | 10/2004 | Yokomoto et al. | 134/61 |
| 2005/0274401 A1 | * | 12/2005 | Nagami et al. | 134/102.3 |

* cited by examiner

*Primary Examiner*—Parviz Hassanzadeh
*Assistant Examiner*—Sylvia MacArthur
(74) *Attorney, Agent, or Firm*—Wei Te Chung

(57) ABSTRACT

An etching system (3) includes an etching chamber (31), an etchant solution tank (32) connected with the etching chamber, a heater (34) set in the tank, and a deionized water (DIW) adding device. The DIW adding device includes a DIW feeding pipe (36) having a first timer (361), and a clean dry air (CDA) feeding pipe (35) having a second timer (351). The DIW and CDA feeding pipes combine into a main pipe (37) that is connected with the etching chamber. A portion of the DIW feeding pipe is set in the tank and heated by the heater. The temperature of the DIW fed into the etching chamber and the temperature of the etchant solution pumped into the etching chamber are same. Thus when the DIW is fed into the etching chamber, the temperature of the etching chamber does not fluctuate, which can maintain the quality of the etching process.

5 Claims, 2 Drawing Sheets

ETCHING SYSTEM USING A DEIONIZED WATER ADDING DEVICE

BACKGROUND OF THE INVENTION

1. Field of the Invention

The present invention relates to etching systems for etching objects such as metal films deposited on glass substrates used in liquid crystal displays, and particularly to an etching system using a deionized water (DIW) adding device.

2. Description of Prior Art

In the production of a typical thin-film transistor liquid crystal display (TFT LCD), an indium tin oxide (ITO) film deposited on a glass substrate needs to be etched, so as to cut away unwanted ITO material and leave a final desired ITO circuit pattern. Generally, oxalic acid is used as the etchant to etch the ITO film. To regulate and stabilize the concentration of the oxalic acid solution, DIW needs to be added to the solution at appropriate times and in appropriate quantities. Accordingly, a DIW adding device performing this function is used in the etching process.

Referring to FIG. 3, this shows a schematic, side plan view of a conventional etching system 1. The etching system 1 comprises an etching chamber 11, an etchant solution tank 12, an etchant solution feeding pipe 14, and a DIW feeding pipe 13 having a timer 131. The etchant solution tank 12 is filled with an etchant solution (not labeled) such as an oxalic acid solution. The etchant solution generally is heated by a heater (not shown) to a predetermined temperature.

In operation, a pump (not shown) drives the etchant solution from the tank 12 through the etchant solution feeding pipe 14 into the etching chamber 11. Etching is carried out on a workpiece such as a glass substrate in the etching chamber 11. The timer 131 controls opening and closing of the pipe 13. Thus the DIW is added into the etching chamber 11 at appropriate times and in appropriate quantities to stabilize the concentration of the etchant solution in the etching chamber 11.

However, the etching chamber 11 generally is connected with other chambers (not shown) which are used for processing the etched glass substrate. A reactant gas such as an acidic gas occurring in the process of the etching work may easily flow into the other chambers. Similarly, etchant solution adsorbed and held by surface tension on the glass substrate may easily be carried into the other chambers. The reactant gas and the etchant solution may impair the processing of the glass substrate in a next step in another chamber.

Referring to FIG. 4, this shows another conventional etching system 2. The etching system 2 comprises an etching chamber 21, an etchant solution tank 22, an etchant solution feeding pipe 26, a DIW feeding pipe 23 having a timer 231, and a clean dry air (CDA) feeding pipe 24 having a timer 241. The two pipes 23, 24 combine into a main pipe 25. The timers 231, 241 respectively control the pipes 23, 24 to open at different times to feed DIW and CDA alternately.

The pipe 24 feeds CDA into the etching chamber 21, so that any reactant gas in the etching chamber 21 is diluted and effectively eliminated before it can flow into the next chamber. The CDA also blows off the etchant solution held on the glass substrate.

The CDA and the reactant gas at the end of the main pipe 25 in the etching chamber 21 flow intensely, and this is where certain mechanisms (not shown) of the etching chamber 21 are located. As a result, etchant solution located on the mechanisms near the end of the main pipe 25 crystallizes easily. The crystallized etchant solution can hamper the movement of the mechanisms. Therefore the DIW feeding pipe 23 feeds DIW to dissolve and remove the crystallized etchant solution.

The etching system 2 has the following disadvantage. The DIW fed by the pipe 23 is generally at room temperature, while the temperature of the etchant solution in the etching chamber 21 is higher than room temperature. Thus when the DIW is fed into the etching chamber 21, the temperature of the etching chamber 21 fluctuates, which can reduce the accuracy and efficacy of the etching being carried out.

Thus, a new etching system which overcomes the above-mentioned disadvantage is desired.

SUMMARY OF THE INVENTION

An object of the present invention is to provide an etching system which enables very high quality etching to be performed.

In order to achieve the object set out above, the present invention provides an etching system comprising an etching chamber, an etchant solution tank connected with the etching chamber, a heater used to heat the etchant solution tank, and a DIW adding device. The DIW adding device comprises a DIW feeding pipe having a first timer, and a CDA feeding pipe having a second timer. The DIW feeding pipe and the CDA feeding pipe are connected with the etching chamber. Opening and closing of the DIW feeding pipe and the CDA feeding pipe are controlled by the first timer and the second timer, respectively. A portion of the DIW feeding pipe is heated by the heater.

Said portion of the DIW feeding pipe is heated by the same heater used to heat the etchant solution in the etchant solution tank. Therefore the temperature of the DIW fed into the etching chamber and the temperature of the etchant solution pumped into the etching chamber are same. Thus when the DIW is fed into the etching chamber, the temperature of the etching chamber does not fluctuate, which can maintain the quality of the etching being carried out.

Other objects, advantages, and novel features of the present invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
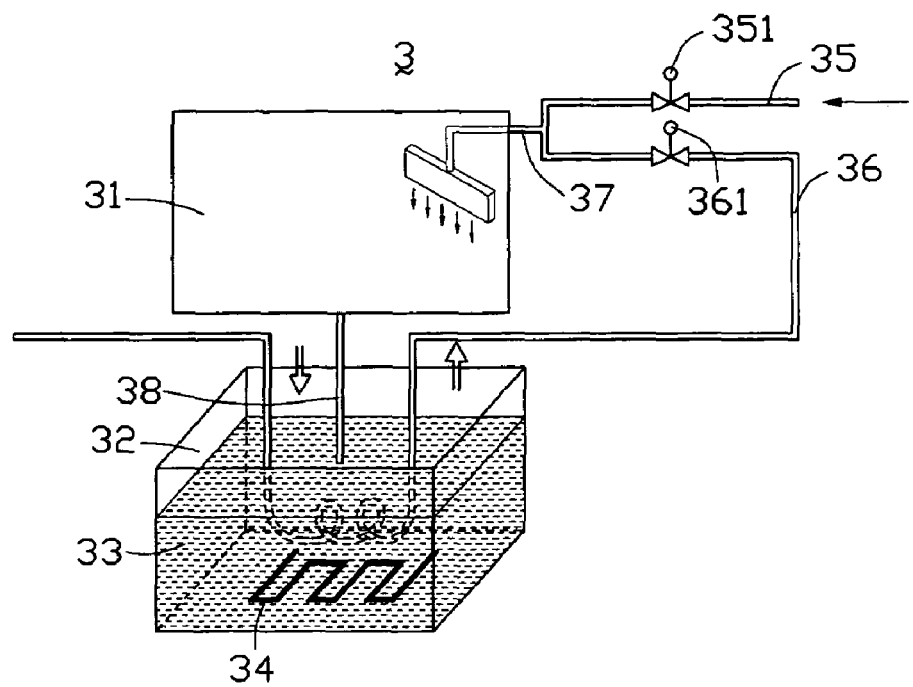
FIG. 1 is a schematic diagram of a first embodiment of an etching system according to the present invention.

Referring to FIG. 1, this shows an etching system 3 according to the first embodiment of the present invention. The etching system 3 comprises an etching chamber 31, an etchant solution tank 32, and a DIW adding device (not labeled).

The etching chamber 31 is connected with the etchant solution tank 32 by an etchant solution feeding pipe 38. The etchant solution tank 32 is filled with an etchant solution 33, such as an oxalic acid solution. A heater 34 is set in the etchant solution tank 32, and is used to heat the etchant solution 33. The DIW adding device comprises a DIW feeding pipe 36 having a timer 361, and a CDA feeding pipe 35 having a timer 351. The two pipes 35, 36 combine into a main pipe 37 that goes into the etching chamber 31. The timers 351, 361 respectively control the pipes 35, 36 to open alternately. A portion of the DIW feeding pipe 36 is set in the etchant solution tank 32 above the heater 34.

In operation, the etchant solution 33 in the tank 32 is pumped through the pipe 38 into the etching chamber 31 by a pump (not shown). Etching of a workpiece is carried out in the etching chamber 31. DIW passing through the pipe 36 is heated by the heater 34, and is subsequently fed into the etching chamber 31. CDA is fed into the etching chamber 31 through the pipe 35. The timers 351, 361 respectively control the pipes 35, 36 to open at different times to feed the DIW and the CDA alternately.

Because the DIW passing through the pipe 36 and the etchant solution 33 in the etchant solution tank 32 are both heated by the heater 34, the temperature of the DIW fed into the etching chamber 31 and the temperature of the etchant solution 33 pumped into the etching chamber 31 are same. Thus when the DIW is fed into the etching chamber 31, the temperature of the etching chamber 31 does not fluctuate, which can maintain the quality of the etching being carried out. In addition, by the operation of the timers 351, 361, the DIW adding device can also stabilize the concentration of the etchant solution 33 in the etching chamber 31. Moreover, the DIW adding device can dissolve and remove any crystallized etchant solution 33 that forms inside the etching chamber 31.

Figure 2:
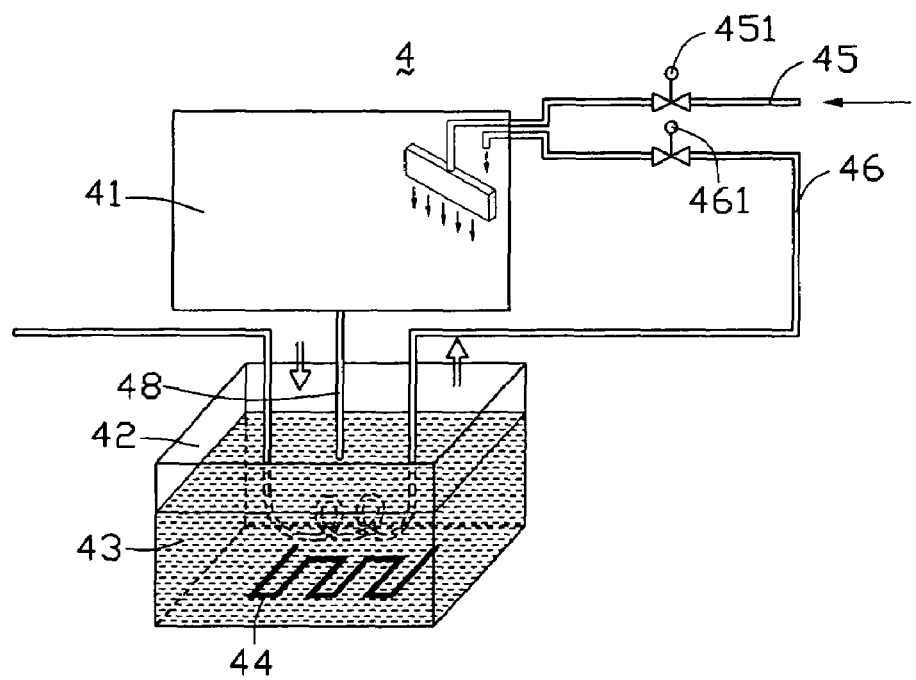
FIG. 2 is a schematic diagram of a second embodiment of an etching system according to the present invention.
Figure 3:
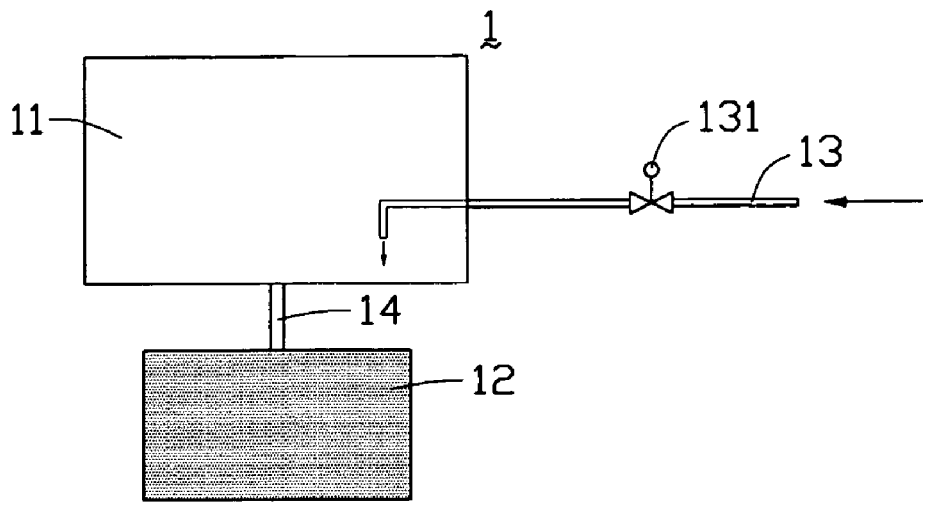
FIG. 3 is a schematic, side plan view of a conventional etching system.
Figure 4:
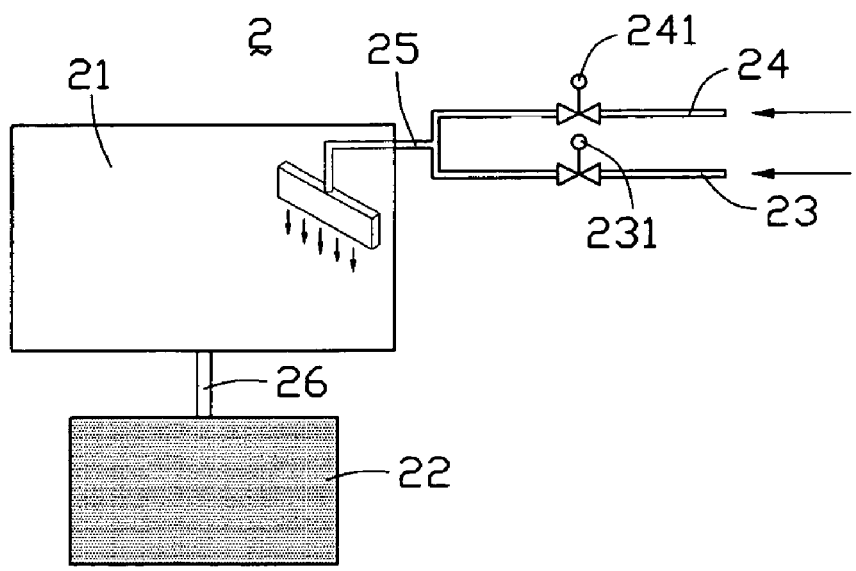
FIG. 4 is essentially a schematic, side plan view of another conventional etching system.

Referring to FIG. 2, this shows an etching system 4 according to the second embodiment of the present invention. The etching system 4 comprises an etching chamber 41, an etchant solution tank 42, and a DIW adding device (not labeled).

The etching chamber 41 is connected with the etchant solution tank 42 by an etchant solution feeding pipe 48. The etchant solution tank 42 is filled with an etchant solution 43 such as an oxalic acid solution. A heater 44 is set in the etchant solution tank 42, and is used to heat the etchant solution 43. The DIW adding device comprises a DIW feeding pipe 46 having a timer 461, and a CDA feeding pipe 45 having a timer 451. The two pipes 45, 46 go into the etching chamber 41 separately. The pipes 45, 46 are controlled by the timers 451, 461 respectively. A portion of the pipe 46 is set in the etchant solution tank 42 above the heater 44. The etching system 4 has substantially the same advantages as those described above regarding the etching system 3.

In alternative embodiments, the heaters 34, 44 can be set at exteriors of the tanks 32, 42 respectively, to heat the etchant solutions 33, 43 and said portions of the pipes 36, 46.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. An etching system, comprising:
an etching chamber, an etchant solution tank providing etchant solution into the etching chamber; a heater used to heat the etchant solution tank; and a deionized water adding device, comprising: a deionized water feeding pipe positioned in the tank having a first timer, and providing deionized water into the etching chamber; and a clean dry air feeding pipe having a second timer, and providing clean dry air into the etching chamber; wherein, the deionized water feeding pipe and the clean dry air feeding pipe are connected with the etching chamber, opening and closing of the deionized water feeding pipe and the clean dry air feeding pipe are controlled by the first timer and the second timer respectively, and a portion of the deionized water feeding pipe and the etchant solution in the etchant solution tank are both heated by the heater.

2. The etching system as recited in claim 1, wherein the deionized water feeding pipe and the clean dry air feeding pipe combine into a main pipe, with the main pipe being connected with the etching chamber.

3. The etching system as recited in claim 1, wherein the heater is set in the etchant solution tan, and the heater is configured for heating the etchant solution and the deionized water to a similar temperature.

4. The etching system as recited in claim 1, wherein the heater is set at an exterior of the etchant solution tank, and the heater is configured for heating the etchant solution and the deionized water to a similar temperature.

5. The etching system as recited in claim 1, wherein the etchant solution is an oxalic acid solution.

* * * * *